US011195767B2

(12) United States Patent
Walke et al.

(10) Patent No.: US 11,195,767 B2
(45) Date of Patent: Dec. 7, 2021

(54) INTEGRATION OF A III-V DEVICE ON A SI SUBSTRATE

(71) Applicant: IMEC VZW, Leuven (BE)

(72) Inventors: Amey Mahadev Walke, Heverlee (BE); Liesbeth Witters, Lubbeek (BE); Niamh Waldron, Heverlee (BE); Robert Langer, Heverlee (BE); Bernardette Kunert, Wilsele (BE)

(73) Assignee: IMEC VZW, Leuven (BE)

( * ) Notice: Subject to any disclaimer, the term of this patent is extended or adjusted under 35 U.S.C. 154(b) by 161 days.

(21) Appl. No.: 16/550,085

(22) Filed: Aug. 23, 2019

(65) Prior Publication Data
US 2020/0091003 A1  Mar. 19, 2020

(30) Foreign Application Priority Data
Sep. 13, 2018  (EP) .................................... 18194368

(51) Int. Cl.
| | |
|---|---|
| *H01L 21/8258* | (2006.01) |
| *H01L 29/66* | (2006.01) |
| *H01L 21/3105* | (2006.01) |
| *H01L 21/3065* | (2006.01) |
| *H01L 29/423* | (2006.01) |
| *H01L 21/308* | (2006.01) |

(52) U.S. Cl.
CPC ........ *H01L 21/8258* (2013.01); *H01L 21/308* (2013.01); *H01L 21/3065* (2013.01); *H01L 21/31053* (2013.01); *H01L 29/42316* (2013.01); *H01L 29/66462* (2013.01); *H01L 29/66545* (2013.01); *H01L 29/66795* (2013.01)

(58) Field of Classification Search
None
See application file for complete search history.

(56) References Cited

U.S. PATENT DOCUMENTS

| | | |
|---|---|---|
| 8,487,316 B2 | 7/2013 | Cheng et al. |
| 8,759,169 B2 | 6/2014 | Kittler et al. |
| 9,431,243 B2 | 8/2016 | Lochtefeld et al. |

(Continued)

FOREIGN PATENT DOCUMENTS

| | | |
|---|---|---|
| WO | 2017/039587 A1 | 3/2017 |
| WO | 2017/171829 A1 | 10/2017 |
| WO | 2018/007711 A1 | 1/2018 |

OTHER PUBLICATIONS

European Search Report, European Patent Application No. 18194368. 9, dated Feb. 22, 2019, 8 pages.

(Continued)

*Primary Examiner* — Jack S Chen
(74) *Attorney, Agent, or Firm* — McDonnell Boehnen Hulbert & Berghoff LLP (57) ABSTRACT

A method for forming a semiconductor structure comprising: providing a silicon substrate having a first and a second flat top surface belonging to a first and a second substrate region respectively, the first top surface being lower than the second top surface, thereby forming a step delimiting the first and the second substrate region. The method further comprises forming, at least partially, one or more silicon semiconductor devices in the second substrate region, and forming, at least partially, one or more III-V semiconductor devices in the first substrate region.

12 Claims, 10 Drawing Sheets

(56) References Cited

U.S. PATENT DOCUMENTS

| | | |
|---|---|---|
| 9,508,640 B2 | 11/2016 | Cheng et al. |
| 9,660,069 B2 | 5/2017 | Bayram et al. |
| 2008/0070355 A1 | 3/2008 | Lochtefeld et al. |
| 2008/0169474 A1 | 7/2008 | Sheppard |
| 2010/0213512 A1 | 8/2010 | Ko |
| 2012/0305992 A1 | 12/2012 | Marino et al. |
| 2013/0271208 A1 | 10/2013 | Then et al. |
| 2017/0229480 A1 | 8/2017 | Jin et al. |
| 2019/0051562 A1* | 2/2019 | Radosavljevic .. H01L 21/76224 |

OTHER PUBLICATIONS

Bin Lu, Jin Wook Chung et al., "On-Wafer Seamless Integration of GaN and Si (100) Electronics", 2009 Annual IEEE Compound Semiconductor Integrated Circuit Symposium, 2009, pp. 1-4.

Shichijo, Hisashi et al., "Co-Integration of GaAs MESFET and Si CMOS Circuits", IEEE Electron Device Letters, vol. 9, No. 9, Sep. 1988, pp. 444-446.

Kazior, Thomas E., "Beyond CMOS: Heterogeneous Integration of III-V Devices, RF MEMS and Other Dissimilar Materials/Devices With Si CMOS to Create Intelligent Microsystems", Philosophical Transactions of The Royal Society A, 372, 2014, pp. 1-15.

Lee, Ko-Tao et al., "GaN Devices on a 200 mm Si Platform Targeting Heterogeneous Integration", IEEE Electron Device Letters, vol. 38, No. 8, Aug. 2017, pp. 1094-1096.

* cited by examiner

INTEGRATION OF A III-V DEVICE ON A SI SUBSTRATE

CROSS-REFERENCE TO RELATED APPLICATIONS

The present application is a non-provisional patent application claiming priority to European Patent Application No. 18194368.9, filed on Sep. 13, 2018, the contents of which are hereby incorporated by reference.

FIELD OF THE DISCLOSURE

The present disclosure relates to the integration of III-V device on Si substrate.

BACKGROUND

III-V devices have benefit from a higher mobility than Si-based devices as they can be operated at higher frequencies (beyond 100 GHz). For instance, III-V devices such as High Electron Mobility Transistors (HEMTs) are used in RF circuits. In particular, HEMTs are used in low noise amplifiers. HEMTs are typically designed with III-V materials such as GaAs, InGaAs, InGaAs, InAlAs, InP, GaN, AlGaN etc. In commercial applications, HEMT-based RF circuits are fabricated on GaAs or InP wafers which are smaller (2" to 6" wafer) in size and far more expensive than 300 mm Si wafers. It would therefore be economical to find a way to fabricate a III-V device on a Si wafer. Furthermore, Bringing III-V devices on a Si platform would allow them to integrate with digital/Analog CMOS technology.

Today, RF circuits and CMOS circuits are implemented on separate wafers. Indeed, bringing III-V and Si devices on the same platform proved a very challenging task so far.

For instance, Jin Wook Chung et al. (Compound Semiconductor Integrated Circuit Symposium, 2009. CISC 2009. Annual IEEE. 2009. 1-4.) describes the integration of a HEMT device with a P-type metal-oxide-semiconductor (PMOS) device on a Si substrate. In that work, GaN/AlGaN layers are first transferred on a Si wafer with oxide in between. Then, another Si layer is stacked on the GaN/AlGaN layers separated by bonding oxide. The PMOS is then processed on the top Si layer and the GaN is processed by removing the top Si layer in some regions. However, this approach involves multiple substrate transfer steps, which is tedious and labour-intensive.

SUMMARY

The present disclosure to provides methods for integrating a III-V device with a silicon-based device on a silicon substrate Embodiments of the present disclosure allow epitaxially growing a III-V layer on a Si substrate and costs linked to the use of a III-V substrate can be spared.

Embodiments of the present disclosure allow the fabrication flow to be linear and does not require the assembling of multiple substrates.

Embodiments of the present disclosure involve relatively small amounts of III-V materials compared to integration known methods.

It is yet another aspect of embodiments of the present disclosure that it is compatible with advanced silicon-based and III-V based technologies. In particular, it is compatible with silicon-based FinFET technology involving a high-k dielectric and using a replacement metal gate process, and it is compatible with T-shaped gated III-V HEMT devices also obtained by a replacement metal gate process.

It is a further aspect of embodiments of the present disclosure that it is versatile and permits the co-integration of various silicon-based device types with various III-V based device types. In particular, the present disclosure is compatible with the integration of III-V based high-electron mobility transistors (HEMTs), MOSFETs, modulators, and sensors, amongst others, with silicon-based devices such as N-type metal-oxide-semiconductor (NMOS), PMOS, and Complementary Metal Oxide Semiconductor (CMOS) devices and in particular with FinFET NMOS, PMOS, and CMOS devices.

It is yet a further aspect of embodiments of the present disclosure that it facilitates the integration of high frequency (>20 GHz) devices with silicon-based devices on a same silicon substrate.

It is yet a further aspect of embodiments of the present disclosure that it permits the formation of temperature-sensitive parts of the III-V semiconductor devices after that high-temperature steps of the silicon semiconductor device formation have been realized. The present disclosure relates to a method for forming a semiconductor structure. The method comprises a step a), and a step b) after step a).

Step a) comprises providing a silicon substrate having a first and a second flat top surface belonging to a first and a second substrate region respectively, the first top surface being lower than the second top surface, thereby forming a step delimiting the first and the second substrate region.

Step b) comprises forming, at least partially, one or more silicon semiconductor devices in the second substrate region, and forming, at least partially, one or more III-V semiconductor devices in the first substrate region.

To avoid confusion between the steps (e.g. a orb) of the method and the step formed by the difference of height between the first and second flat surface of the silicon substrate, the latter may be referred to as the "silicon step".

Step a) involves providing a silicon substrate having a silicon step.

In embodiments, the silicon step permits to expose by chemical-mechanical polishing (CMP) a top portion of a device in construction in the first or second substrate region without simultaneously exposing a device in construction in respectively the second or first substrate region. This permits to save on many masking steps. This aspect may be desirable when silicon-based FinFET technology involving a high-k dielectric and using a replacement metal gate process is integrated with a III-V device, such as III-V HEMT device using a replacement gate process (e.g. for the formation of a T-shaped gated III-V HEMT device).

Another aspect of the silicon step is that it permits, in embodiments, obtaining more easily a wider defect-poor area for processing of a III-V device than would otherwise be possible without the use of the silicon step.

Particular aspects of the present disclosure are set out in the accompanying independent and dependent claims. Features from the dependent claims may be combined with features of the independent claims and with features of other dependent claims and not merely as explicitly set out in the claims.

Although there has been constant improvement, change and evolution of integration methods in this field, the present concepts are believed to represent substantial novel improvements, including departures from prior practices.

The above and other characteristics, features and aspects of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE FIGURES

The above, as well as additional, features will be better understood through the following illustrative and non-limiting detailed description of example embodiments, with reference to the appended drawings.

In the different figures, the same reference signs refer to the same or analogous elements. All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under certain circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under certain circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. Rather, with respect to the present disclosure, the relevant components of the device include A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of some embodiments of the disclosure, various features of the disclosure are sometimes grouped together in a single embodiment, figure, or description thereof for the purpose of streamlining the disclosure and aiding in the understanding of various described aspects. This method of disclosure, however, is not to be interpreted as reflecting an intention that the claimed disclosure involves more features than are expressly recited in each claim. Rather, as the following claims reflect, certain described aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The disclosure will now be described by a detailed description of several embodiments of the disclosure. It is clear that other embodiments of the disclosure can be configured according to the knowledge of persons skilled in the art without departing from the technical teaching of the disclosure, the disclosure being limited only by the terms of the appended claims.

Reference will be made to transistors. These are multi-terminal devices having a first main electrode such as a drain, a second main electrode such as a source and a control electrode such as a gate for controlling the flow of electrical charges between the first and second main electrodes.

It will be clear for a person skilled in the art that, while the findings of the present disclosure are explained with reference to PMOS and NMOS transistors as an example, the present disclosure includes within its scope a complementary device whereby PMOS and NMOS transistors become NMOS and PMOS transistors, respectively. A skilled person can make such modifications without departing from the disclosure.

The present disclosure relates to a method for forming a semiconductor structure comprising:

a) Providing a silicon substrate having a first and a second flat top surface belonging to a first and a second substrate region respectively, the first top surface being lower than the second top surface, thereby forming a step delimiting the first and the second substrate region, b) Forming, at least partially, one or more silicon semiconductor devices in the second substrate region, and forming, at least partially, one or more III-V semiconductor devices in the first substrate region.

The envisioned semiconductor structure can, for instance, be an integrated circuit wherein one or more silicon-based devices and one or more III-V-based devices are co-integrated. The silicon-based devices can, for instance, comprise field effect transistors (FETs). They can comprise FinFETs but they can also comprise planar FETs. In particular, they can comprise NMOS, PMOS, or CMOS structures, comprising FETs such as FinFETs. They can comprise FinFETs comprising a high-k dielectric (e.g. obtained by a replacement gate process). The III-V-based devices can, for instance, comprise HEMTs, modulators, and sensors. They can comprise HEMT devices obtained by a replacement metal gate process. Additionally or alternatively, they can comprise T-shaped gated HEMTs.

Step a) of the method comprises providing a silicon substrate having a first and a second flat top surface belonging to a first and a second substrate region respectively, the first top surface being lower than the second top surface, thereby forming a step delimiting the first and the second substrate region.

This silicon substrate comprising a silicon step can, for instance, be obtained either by etching the first top surface. For this purpose, a flat silicon substrate (e.g. a silicon wafer, such as a 300 mm silicon wafer) can be provided and the first substrate region can be etched thereof so as to lower a top surface of that first substrate region below a top surface of a second substrate region, thereby forming a step delimiting the first and the second substrate region.

Another possibility to provide the silicon substrate having the silicon step is by epitaxially growing the second substrate region on part of a flat Si substrate, thereby creating both the first and the second substrate region, the first region being the region on which the second substrate region has not been grown.

In embodiments, the step may have a height ranging from 50 to 200 nm. Such a height is typically sufficient for the embodiments of the present disclosure (e.g. permitting to expose by CMP a top portion of a device in construction in the first or second substrate region without simultaneously exposing a device in construction in respectively the second or first substrate region; permitting to obtain more easily a wider defect-poor area for processing of a III-V device than would otherwise be possible without the use of the silicon step). However, in some embodiments, the step height may also be outside of this range.

The surface area of the first and of the second flat top surface will depend on the number, size, and density of the devices that will be formed in the first and second regions. The first and the second flat top surface are typically parallel to each other. They are not coplanar. The first and second regions also each comprise a bottom surface. These bottom surfaces are typically coplanar. The "top" surfaces are the surfaces on which step b) may be performed.

The silicon step is typically vertical and forms a right angle with the first and the second top surface.

When looked from above, perpendicularly to the top surfaces, a demarcation line between the first and the second substrate regions is typically a straight line but any line shape can be envisioned.

In the present disclosure, step a may be performed before that step b is started.

Once step a has been performed, step b of forming, at least partially, one or more silicon semiconductor devices in the second substrate region, and forming, at least partially, one or more III-V semiconductor devices in the first substrate region, can be performed.

Step a itself is not to be considered as partially forming a semiconductor device.

In embodiments, for a III-V semiconductor device to be considered partially formed in a substrate region, a III-V material may be formed in that region.

In embodiments, for a silicon semiconductor device to be considered partially formed in a substrate region, at least one amongst the formation of source and drain regions (e.g. in the case of the fabrication of a planar device) or of the formation of a fin (e.g. in the case of the fabrication of a FinFET) may have been performed.

In embodiments, the one or more silicon semiconductor devices may comprise a field effect transistor (FET). For instance, it may comprise a flat FET or a FinFET. For instance, the one or more silicon semiconductor devices may comprise one or more FinFETs. Although the silicon step may be flat or FinFET is formed, it is desirable for the formation of FinFETs. Amongst FinFEts, those comprising a high-k dielectric (e.g. obtained by a replacement gate process) will the most benefit from the presence of the silicon step at the start of the manufacturing process.

In embodiments, the one or more silicon semiconductor devices comprise one or more n-channel metal-oxide-semiconductor-field-effect transistors and one or more p-channel metal-oxide-semiconductor-field-effect transistors.

In embodiments, the one or more III-V semiconductor devices may comprise a HEMTs, a modulator, a light-emitting diode, or a sensor. They can comprise a HEMT device. Further, they may comprise a HEMT device obtained by a replacement metal gate process. They also can comprise a HEMT having a T-shape although other shapes for the gate of the HEMT are also compatible with the present disclosure.

The one or more silicon semiconductor devices is formed in the second substrate region and the one or more III-V semiconductor devices are formed in the first substrate region.

This is may be desirable for at least three reasons: First, this permits obtaining more easily a wider defect-poor area for processing of a III-V device than would otherwise be possible without the use of the silicon step. Second, and this especially applies when FinFETs are formed by a replacement gate process, this permits to expose by CMP the top surface of the dummy gate, without simultaneously exposing the III-V device in construction. Third, this permits the high-temperature steps of the silicon semiconductor device formation to be performed before that the temperature sensitive parts of the III-V device are formed.

The method will now be illustrated for one embodiment as depicted in FIGS. 1 to 15. However, any feature described in this embodiment may be as correspondingly described in any other embodiment of the present disclosure. Also, any feature described in this embodiment is a feature that can be used in any previously described embodiment. All masks described herein are typically hard masks obtained by forming a hard mask layer, forming a photoresist pattern thereon, then transferring the photoresist pattern in the hard mask layer. A typical material for the hard mask is silicon nitride.

Figure 1:
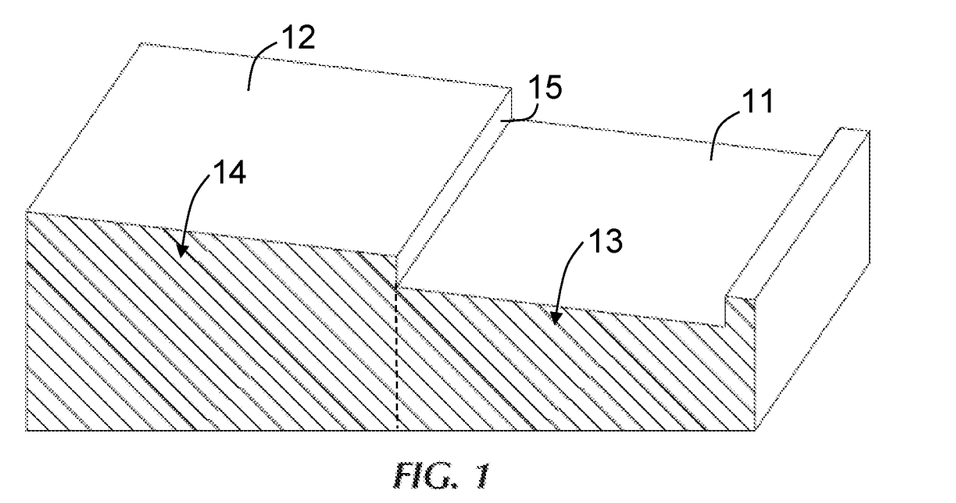
FIG. 1 is a perspective view of an intermediate step in a method according to an example embodiment.
Figure 2:
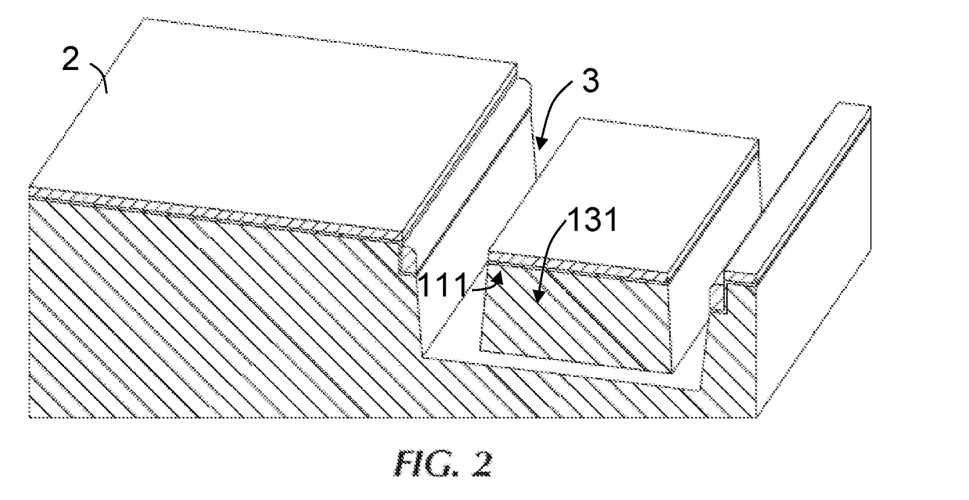
FIG. 2 is a perspective view of an intermediate step in a method according to an example embodiment.
Figure 3:
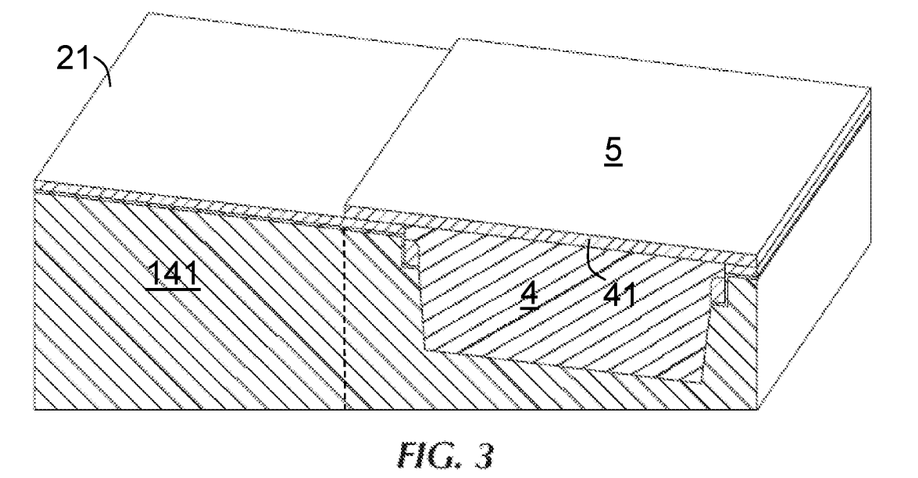
FIG. 3 is a perspective view of an intermediate step in a method according to an example embodiment.

We now refer to FIG. 1.

The method starts by providing a silicon substrate (1) having a first flat top surface (11) and a second flat top surface (12) belonging to a first (13) and a second (14) substrate region respectively, the first top surface (11) being lower than the second top surface (12), thereby forming a step (15) delimiting the first (13) and the second substrate region (14).

In embodiments where the one or more silicon semiconductor devices may be formed in the second substrate region and the one or more III-V semiconductor devices are formed in the first substrate region, step b may comprise the following steps:

(i) Providing a first mask (2) on the second top surface (12) and on part of the first top surface in such a way that an area surrounding a portion of the first surface (11) remains unmasked This step is not depicted in the figures. We now refer to FIG. 2.

(ii) Forming trenches (3) surrounding and defining a portion (111) of the first substrate region (13) by etching the unmasked area surrounding the portion of the first surface (11). The etching is typically an anisotropic dry etching. We now refer to FIG. 3

(iii) Providing a dielectric material (4) on the first substrate region (13) in such a way that the trenches (3) are filled, the first substrate portion (111) is covered, and a top surface (41) of the dielectric material (4) is flat and coplanar with a top surface (21) of the first mask (2) present on the second top surface (12). The dielectric material is typically an oxide such as silicon oxide. In order for the top surface of the dielectric material to be flat and coplanar with a top surface of the first mask, one can typically first provide the dielectric material on both substrate regions until they are covered, then perform a chemical mechanical planarization. These details are not depicted in FIG. 3 which only shows the end result obtained after step (iv) that will now be described.

(iv) Providing a second mask (5) on the flat top surface (41) of the dielectric material (4) while leaving at least part of the second substrate region (14) not masked by this second mask (5). We now refer to FIG. 4.

(v) Forming, at least partially, the one or more silicon semiconductor devices (6) in the second substrate region (14, 141) not masked by the second mask (5). The structures depicted in FIG. 4 forms part of a partially formed CMOS structure comprising nMOS FinFETs and pMOS FinFETS.

In embodiments, wherein the one or more silicon semiconductor devices comprise one or more Fin Field Effect Transistors, step (v) may comprise:

a. etching one or more silicon fins in the silicon substrate;

b. providing a dielectric material on the second substrate region in such a way as to cover the one or more silicon fins, c. planarizing the dielectric material by chemical mechanical planarization until the dielectric material is coplanar with a top surface of the one or more silicon fins, d. recessing the dielectric material around the one or more silicon fins so as to partly uncover the one or more silicon fins, e. forming dummy gates across the one or more silicon fins, f. forming spacers on sidewalls of the one or more silicon fins, and g. forming sources and drains.

Figure 4:
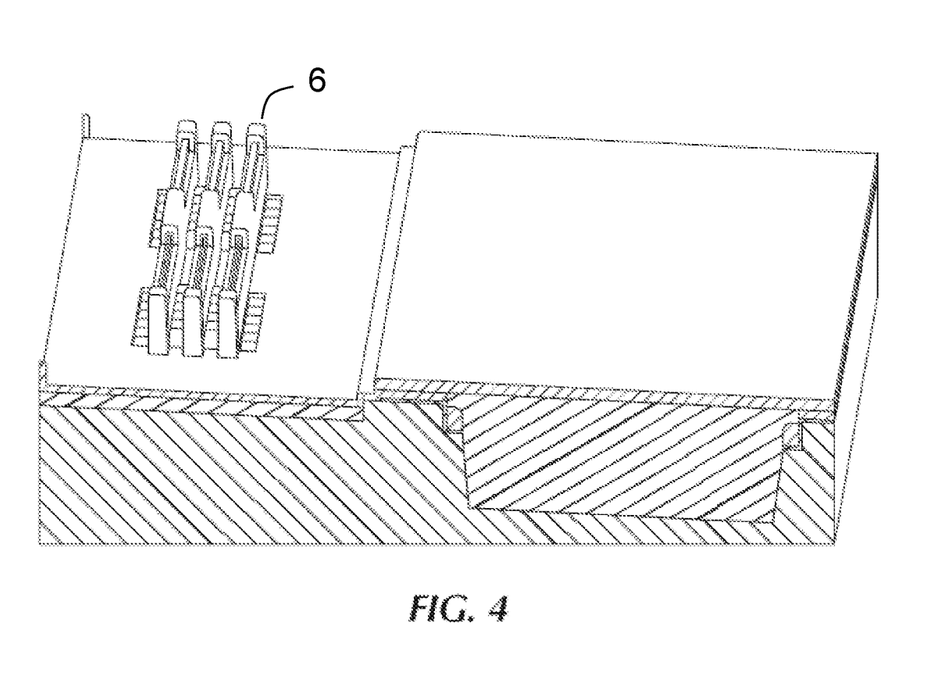
FIG. 4 is a perspective view of an intermediate step in a method according to an example embodiment.

We will now describe in more details how a CMOS structure as depicted in FIG. 4 can be formed. This will not be accompanied by figures because this part of the disclosure is not different from the state of the art. First, two parallel groups of parallel fins can be etched in the second silicon substrate region, a first group is destined to form the nMOS FinFETs while a second group is destined to form the pMOS FinFETs. Then, a dielectric material such as an oxide (typically silicon dioxide) can be provided on both regions followed by CM' until the top of the dielectric material is coplanar with the top of the second mask (5). Next, the dielectric material can be recessed around the fins and dummy gates can be formed having a longitudinal direction perpendicular to the longitudinal direction of the silicon fins. A spacer material can then be formed conformally around the dummy gates. At this stage, a mask can be provided to cover the second group of fins while leaving the first group of fins uncovered. The spacer material present around the first group of fins can be recessed to expose the top of the dummy gates of the first group of fins and to form spacers on each side of each dummy gate. Then, source and drain areas can be formed for the nMOS. These areas can typically be formed by epitaxial growth of doped Si on the fins, on either side of its dummy gate. At this stage, a mask can be provided to cover the first group of fins while leaving the second group of fins uncovered. The spacer material present around the second group of fins can then be recessed to expose the top of the dummy gates of the second group of fins and to form spacers on each side of each dummy gate. Then, source and drain areas can be formed for the pMOS. These areas can typically be formed by epitaxial growth of doped Si on the fins, on either side of its dummy gate. The mask over the nMOS can then be opened. The intermediate structure obtained thereby is depicted in FIG. 4. Steps (vi) and (vii) are not depicted but will now be described.

(vi) Providing a dielectric material (7) on both substrate regions (13, 14) in such a way that the dielectric material (7) possesses a flat top surface and covers the one or more at least partially formed silicon semiconductor devices (6). The top surface of the dielectric material (7) can be coplanar with the top surface of the dummy gates of the CMOS but can also be at a higher level at this stage.

Figure 5:
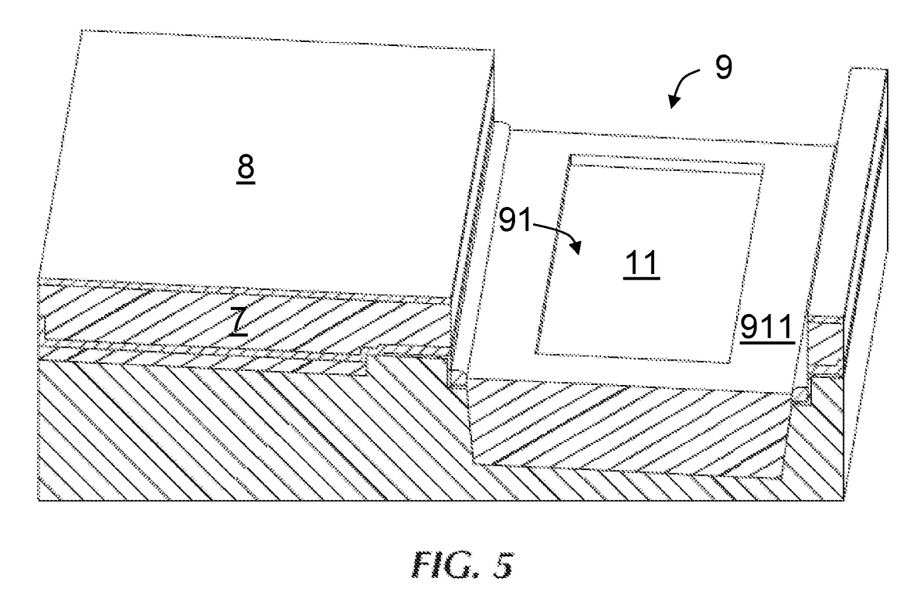
FIG. 5 is a perspective view of an intermediate step in a method according to an example embodiment.

(vii) Covering the second region (14) with a third mask (8) while leaving at least part of the first region (13) not masked by this third mask (8). The part of the first region which is not masked will be where the III-V structure will be formed. The result of step (viii), that will be described next, is depicted in FIG. 5.

(viii) Etching the unmasked first region (13) until a first cavity (9) is formed having a bottom (91) exposing the portion of the first surface (11). The exposed portion of the first surface is surrounded by part (911) of the bottom (91) of the first cavity (9). We now refer to FIG. 6.

Figure 6:
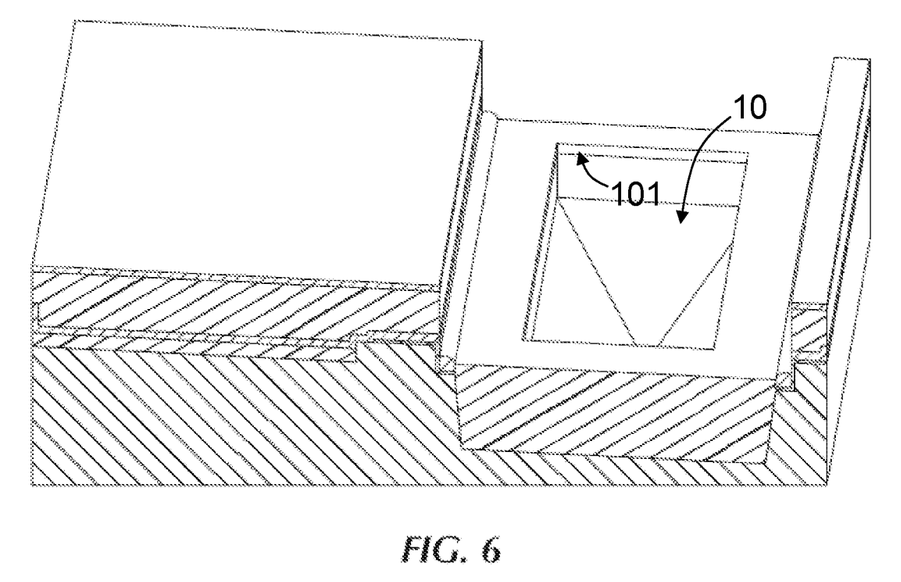
FIG. 6 is a perspective view of an intermediate step in a method according to an example embodiment

(ix) Forming a second cavity (10) at the bottom (91) of the first cavity (9), the second cavity (10) being suitable for trapping defects during epitaxial growth of a III-V material (35) therein, the second cavity (10) having an opening (101) surrounded by part (911) of the bottom (91) of the first cavity (9). Examples of such cavities suitable for trapping defects are known in the art. A typical example for the second cavity formed in step (ix) is a V-shaped groove. It can be formed by etching with tetramethylammonium hydroxide (TMAH) in the Si substrate. For instance, a bottom portion of the groove may be defined by two crystalline planes having miller indexes (111). In particular, it may have a vertical cross-section having a V-shape and be defined by two crystalline planes having miller indexes (111). The groove as such and the shape and crystal orientation of the bottom portion hinder threading dislocations and other crystal defects in the growing III-V material. The III-V material can, for instance, be InP.

We now refer to FIGS. 7A-7F.

Figure 7A:
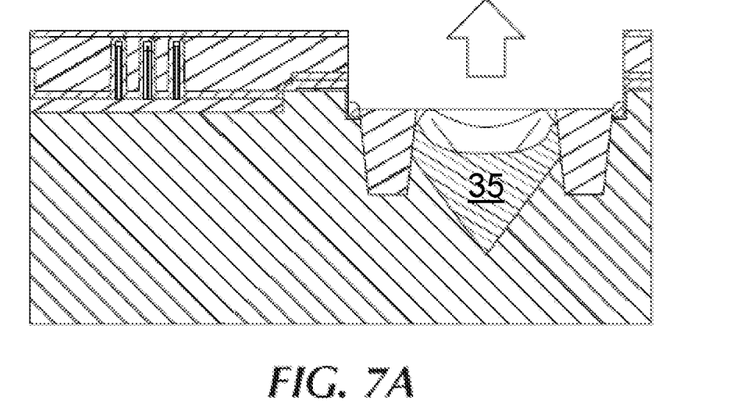
FIG. 7A-7F are vertical cross-sections showing selected intermediate steps in an embodiment of the present disclosure.
Figure 7B:
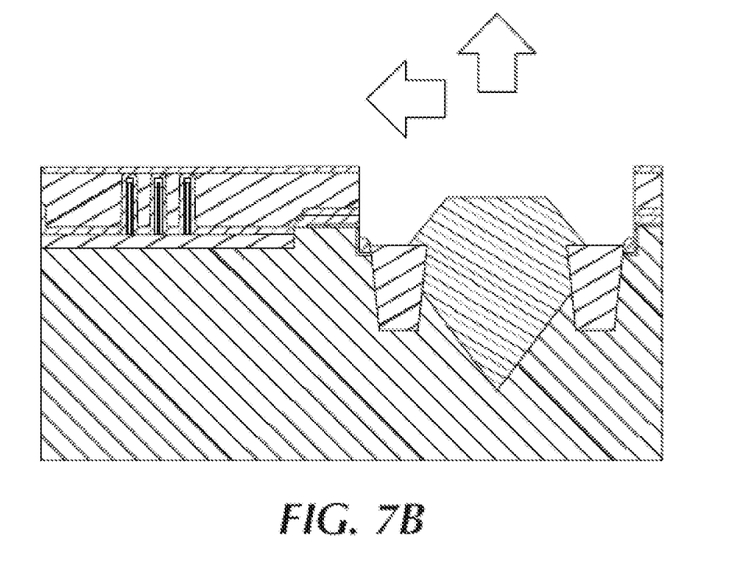
Figure 7C:
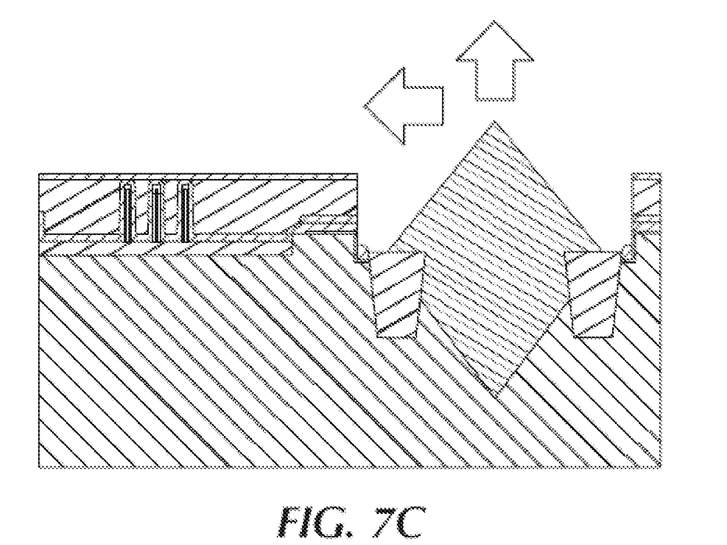
Figure 7D:
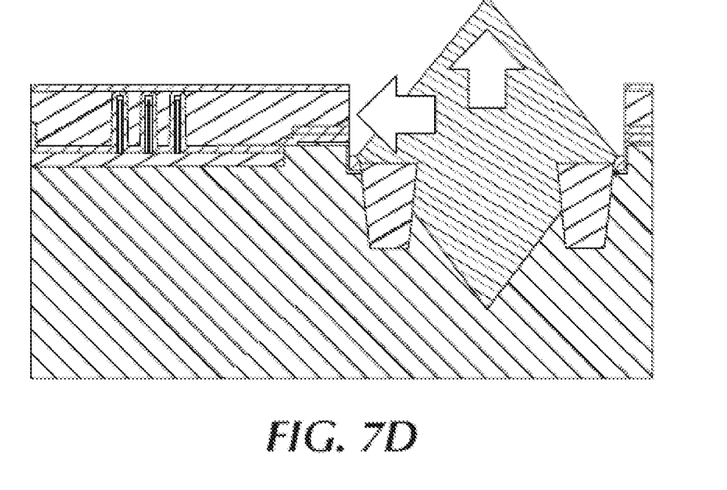
Figure 7E:
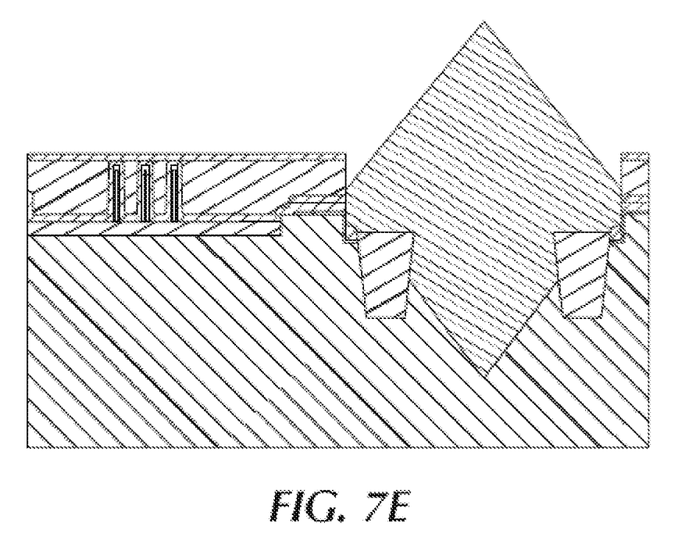
Figure 7F:
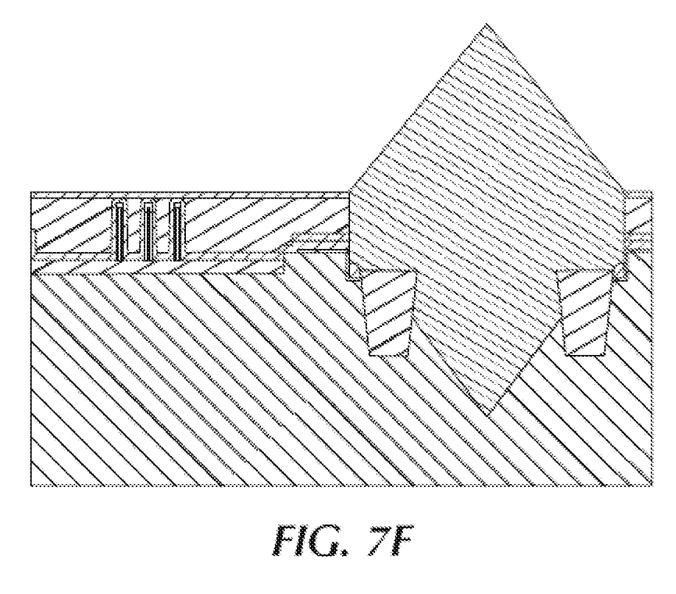
Figure 8:
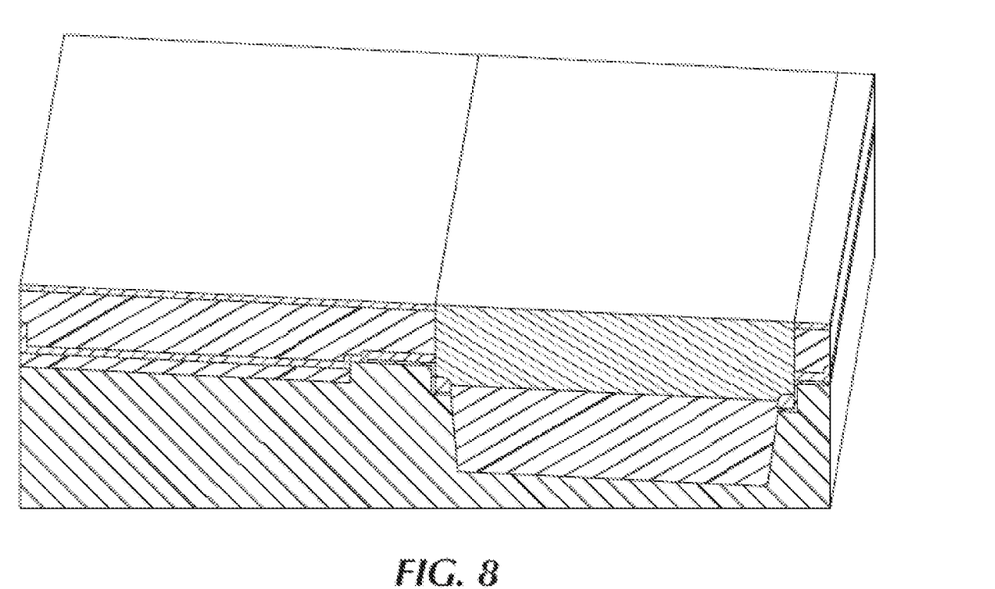
FIG. 8 is a perspective view of an intermediate step in a method according to an example embodiment.
Figure 9:
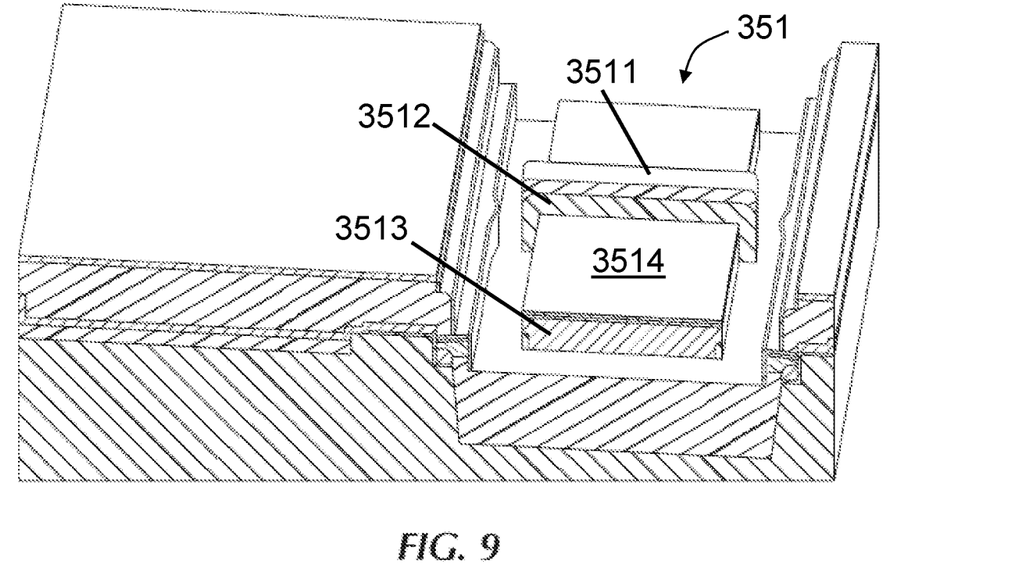
FIG. 9 is a perspective view of an intermediate step in a method according to an example embodiment.

(x) Epitaxially growing a III-V material (35) in the second cavity (10) until the III-V material (35) fills the first cavity (9). As can be seen in FIGS. 7A and 7B, the III-V material first fills the first cavity. Once the first cavity is filled, the top surface of the III-V material is already almost defect-free because of defect trapping having occurred inside the second cavity. The III-V growing outside of the first cavity in FIGS. 7B-7F is practically defect-free. As can be seen in FIG. 7F, the step introduced in step (a) delimit a lateral extent of the second cavity which is wider than the first cavity. The next step, step (xi), starts with FIG. 8 and proceeds towards FIG. 9. Intermediate steps are not depicted. The intermediate structure depicted in FIG. 9 is one of a HEMT.

(xi) Forming, at least partially, the one or more III-V semiconductor devices (351) from the grown III-V material (35).

We will now describe detailed steps involved in the formation of a HEMT device. First, the III-V material obtained at FIG. 7F is planarized by CMP so that its top surface is coplanar with the top surface of the third hard mask (8). This is depicted in FIG. 8. Then, the III-V material is recessed, for instance to be coplanar with the second top surface, to form a platform from which the HEMT device can be formed. The types of HEMT devices that can be formed are for instance well-known HEMT device structures such as enhancement or depletion HEMTs in single, multichannel or multi-gate configuration.

Figure 10:
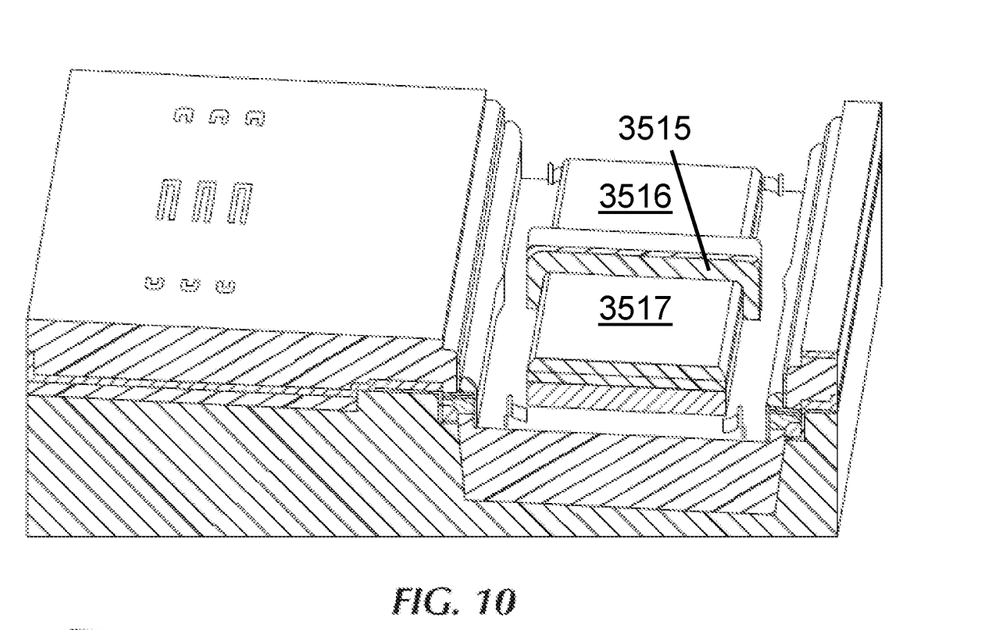
FIG. 10 is a perspective view of an intermediate step in a method according to an example embodiment.

For instance, a stack of III-V layers (e.g. typical of HEMT) can then be grown on the InP. For instance, a buffer layer (e.g. InAlAs) can be grown on the InP, a channel layer (e.g. InGaAs) can be grown on the buffer layer, a spacer layer can be formed on the channel layer (e.g. InAlAs). This will lead to the formation of a two-dimensional electron gas in the channel layer at the interface with the spacer. A Si delta-doping can be performed in the spacer layer. An etch-stop layer (e.g. InP) can be formed on the spacer layer. A cap layer (e.g. n-InGaAs) can be added on the etch stop layer. Next, an oxide layer, that will serve as a mask, can be deposited over both substrate regions. This oxide mask can then be patterned to define the HEMT active area. The III-V stack of layers can than be etched by using this patterned oxide as a mask. The oxide mask can then be removed. In embodiments where step (xi) comprises forming a HEMT having a dummy gate, step (xi) may further comprise the following steps after the stack of III-V layers has been formed (e.g. after the oxide mask has been removed): depositing a dummy gate oxide (3514) on top of the III-V stack (e.g. on top of the cap layer); depositing a spacer material on top and on the side walls of the III-V stack; removing the spacer material which is on top of the III-V stack by anisotropic etching in order to form the spacers (3513); depositing a dummy gate on top of the dummy gate oxide (3514); depositing an oxide layer, that will serve as a mask, over both substrate regions; patterning this oxide layer to form a mask (3511) having the planar shape wished for the dummy gate; and etch the dummy gate (3512) by using the oxide mask (3511) as a mask. FIG. 9 shows a structure after that step. A partially formed III-V semiconductor device (351) is visible. FIG. 10 shows that same partially formed III-V device after a further step where spacers (3515) have been formed around the dummy gate, after the third mask (8) has been removed, and after selective epitaxial growth of an N+ source (3516) and an N+ drain (3517). Epitaxial growth of the source and drain regions may avoid damaging the partially formed III-V device, which could occur if implantation and thermal activation is used.

In embodiments where step (v) comprises forming one or more silicon Fin Field Effect Transistors having a dummy gate and step (xi) comprises forming a HEMT having a dummy gate, the following steps (illustrated in FIGS. 11-15) may be performed after the one or more III-V semiconductor devices (351) have been partially formed from the grown III-V material step (xi):

(xii) Providing a dielectric material on both substrate regions in such a way that the dielectric material possesses a flat top surface coplanar with an exposed top surface of the dummy gate of the one or more silicon Fin Field Effect Transistors. In this step, the dielectric material can, for instance, be an oxide such as silicon oxide and providing this dielectric material may involve a CMP step after deposition of a blanket layer of dielectric material. This step is not depicted in the figures. We now refer to FIG. 11.

Figure 11:
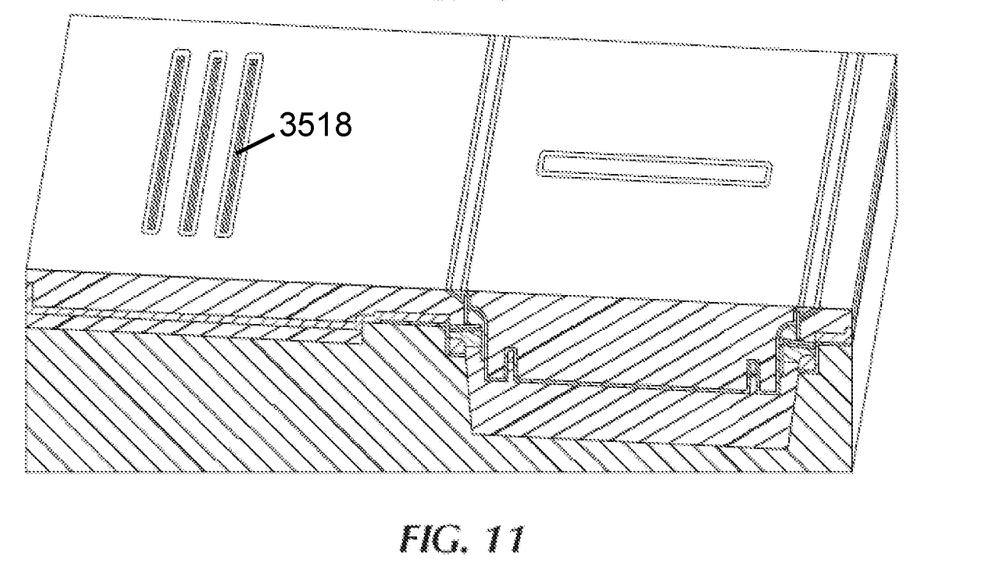
FIG. 11 is a perspective view of an intermediate step in a method according to an example embodiment.

(xiii) Replacing the dummy gate of the one or more silicon Fin Field Effect Transistors by a metal gate (3518).

(xiv) Providing a dielectric material on both substrate regions in such a way that the dielectric material possesses a flat top surface covering the metal gate of the one or more silicon Fin Field Effect Transistors. This step is not depicted.

Figure 14:
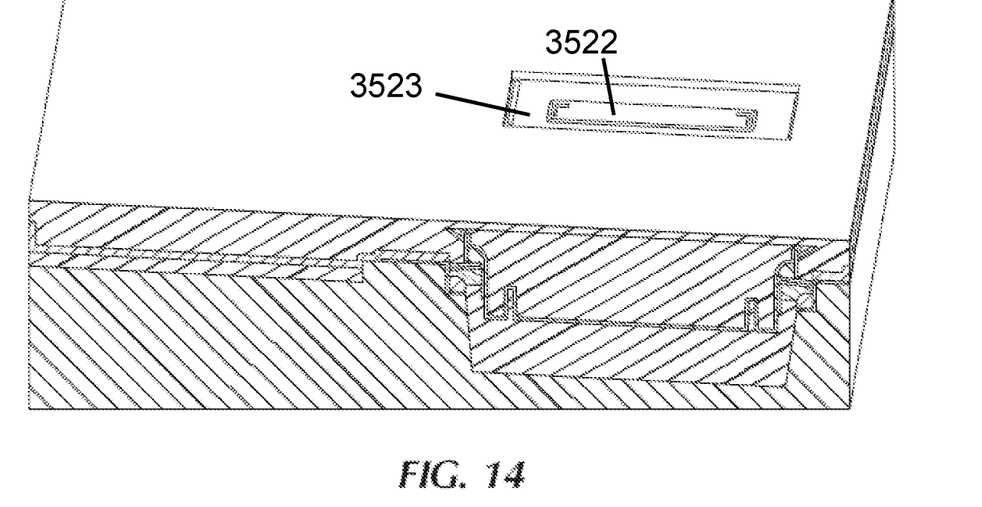
FIG. 14 is a perspective view of an intermediate step in a method according to an example embodiment.
Figure 15:
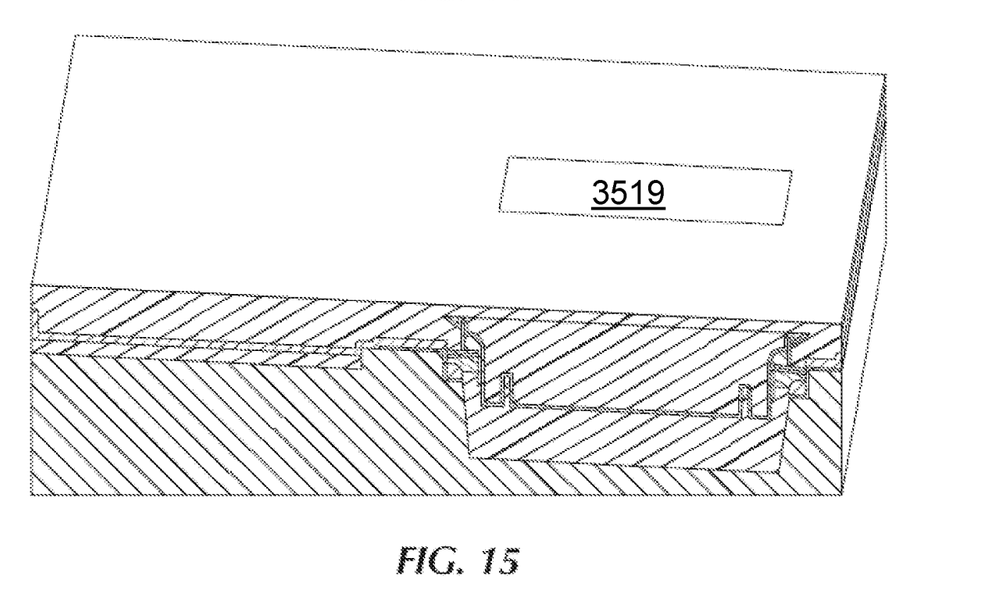
FIG. 15 is a perspective view of an intermediate step in a method according to an example embodiment.

We now refer to FIGS. 14 and 15.

(xv) Replacing the dummy gate of the High-Electron-Mobility transistor by a metal gate (3519). As can be seen in FIG. 14, this may involve removing the dummy gate, the dummy gate oxide, and at least a portion of each III-V layer present between the gate oxide and the barrier layer (typically the cap layer and the etch-stop layer), thereby leaving a first gate cavity (3522), forming a second gate cavity (3523), wider and longer than the first cavity, on top of the first cavity and overlapping the same, thereby forming a T-shaped cavity (3522, 3523) comprising the first and second cavity. Then, the T-shaped cavity can be filled with a conductive material to form a T-shaped gate (3519). Optionally, a gate dielectric can be deposited at least on the bottom of the T-shaped cavity before filling the rest of the T-shaped cavity with a conductive material. This way, a MOSFET can be made.

Figure 12:
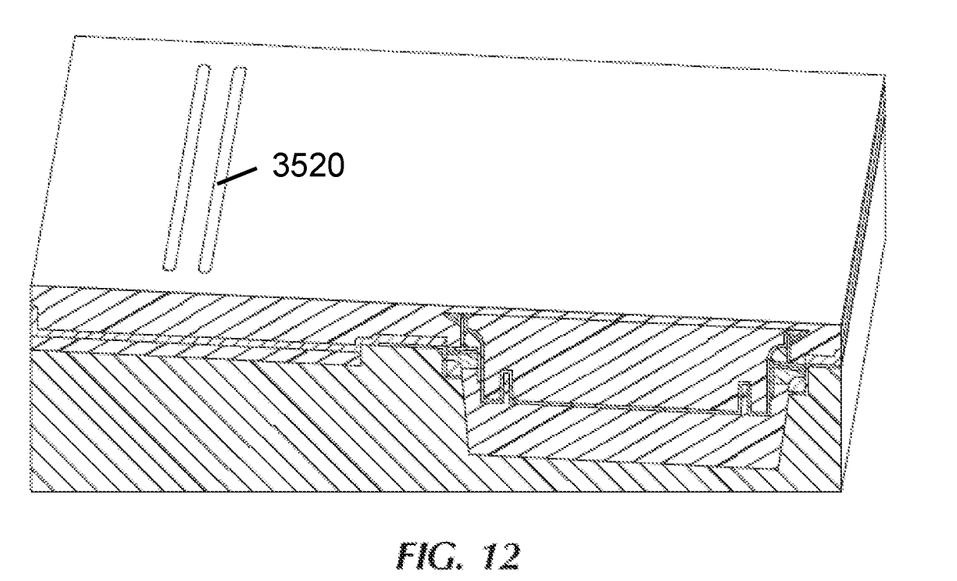
FIG. 12 is a perspective view of an intermediate step in a method according to an example embodiment.
Figure 13:
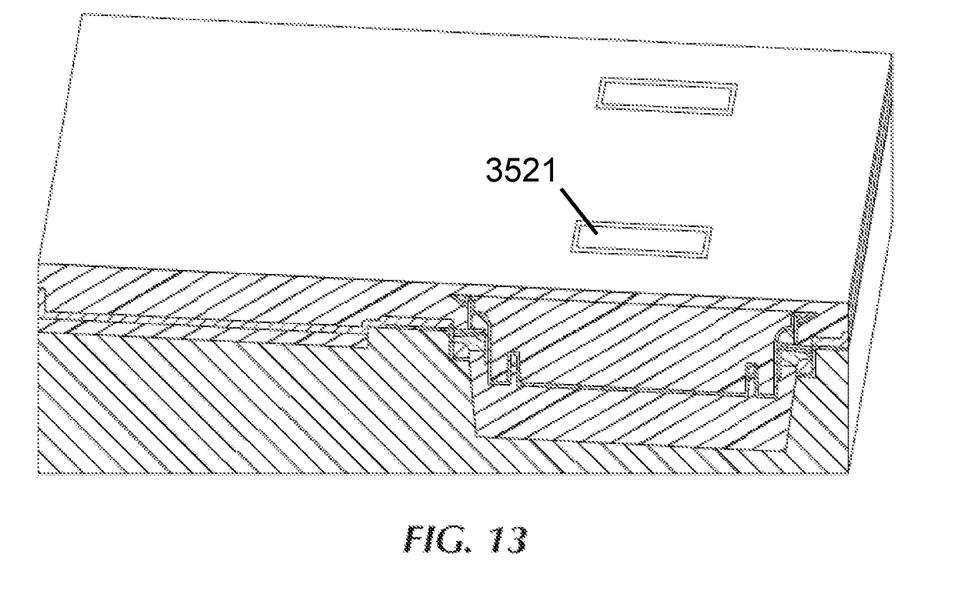
FIG. 13 is a perspective view of an intermediate step in a method according to an example embodiment.

After step (xiii) and before step (xiv), a further typical step involves the formation of source and drain contacts (3520, 3521) for the FinFETs and for the HEMT. For instance, the source and drain contacts for the FinFETs may first be formed. This is depicted in FIG. 12. This step typically involves providing a dielectric material (typically $SiO_2$) on both substrate regions in such a way that the dielectric material possesses a flat top surface covering the metal gate of the one or more silicon Fin Field Effect Transistors, followed by CMP until the surface becomes flat and before the gate region is revealed. This is followed by forming the source and drain contacts. This typically involves making trenches in the oxide until the source and drain regions are reached followed by deposition of one or more contact metal layers and CMP until the metals remains only inside the contact trenches and is removed from rest of the regions. If the source and drain contacts for the FinFETs have first been formed, the next step may be to form the source and drain contacts for the HEMT. This is depicted in FIG. 13.

In embodiments, steps (iii), (vi), (xii), and/or (xiv) may comprise providing a silicon oxide as the dielectric material, and obtaining a flat top surface may involve a chemical mechanical planarization step of the silicon oxide.

It is to be understood that although certain embodiments, specific constructions and configurations, as well as materials, have been discussed herein for devices according to the present disclosure, various changes or modifications in form and detail may be made without departing from the scope of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

What is claimed is:

1. A method for forming a semiconductor structure comprising:
    providing a silicon substrate having a first flat top surface and a second flat top surface belonging to a first substrate region and a second substrate region respectively, the first flat top surface being lower than the second flat top surface, thereby forming a step delimiting the first substrate region and the second substrate region; and
    forming, at least partially, one or more silicon semiconductor devices in the second substrate region and at least partially one or more III-V semiconductor devices in the first substrate region, wherein forming, at least partially, one or more silicon semiconductor devices in the second substrate region and at least partially, one or more III-V semiconductor devices in the first substrate region comprises:
        providing a first mask on the second flat top surface of the second substrate region and on part of the first flat top surface of the first substrate region in such a way that an area surrounding a portion of the first flat top surface remains unmasked;
        forming trenches surrounding a portion of the first substrate region by etching the unmasked area surrounding the portion of the first flat top surface;
        providing a dielectric material on the first substrate region in such a way that the trenches are filled, the first substrate portion is covered, and a top surface of the dielectric material is flat and coplanar with a top surface of the first mask present on the second flat top surface;
        providing a second mask on the top surface of the dielectric material while leaving at least part of the second substrate region not masked by the second mask;
        forming, at least partially, the one or more silicon semiconductor devices in the second substrate region not masked by the second mask;
        providing a dielectric material on the first substrate region and the second substrate region in such a way that the dielectric material possesses a flat top surface, and covers the one or more at least partially formed silicon semiconductor devices;
        covering a second region with a third mask while leaving at least part of the first region not masked by this third mask;
        etching the unmasked first region until a first cavity is formed having a bottom exposing the portion of the first flat top surface;
        forming a second cavity at the bottom of the first cavity, the second cavity being suitable for trapping defects during epitaxial growth of a III-V material therein, the second cavity having an opening surrounded by part of the bottom of the first cavity;
        epitaxially growing a III-V material in the second cavity until the III-V material fills the first cavity; and
        forming, at least partially, the one or more III-V semiconductor devices from the grown III-V material.

2. The method according to claim 1, wherein the step has a height of 50 to 200 nm.

3. The method according to claim 2 wherein the step is a first step, and wherein providing the silicon substrate having the first flat top surface and the second flat top surface belonging to the first substrate region and the second substrate region respectively comprises providing a flat silicon substrate and etching the first substrate region thereof so as to lower a top surface of the first substrate region below a top surface of the second substrate region, thereby forming a second step delimiting the first and the second substrate region.

4. The method according to claim 3, wherein the one or more silicon semiconductor devices comprise one or more n-channel metal-oxide-semiconductor-field-effect transistors and one or more p-channel metal-oxide-semiconductor-field-effect transistors.

5. The method according to claim 4, wherein the one or more silicon semiconductor devices comprise one or more Fin Field Effect Transistors.

6. The method according to claim 5, wherein the one or more of the III-V semiconductor devices comprises one or more High-Electron-Mobility Transistors.

7. The method according to claim 6, wherein the High-Electron-Mobility Transistor has a T-shaped metal gate.

8. The method according to claim 7 wherein the one or more of the Fin Field Effect Transistors or the one or more High-Electron-Mobility Transistors are formed by a replacement metal gate process.

9. The method according to claim 8, wherein forming, at least partially, the one or more silicon semiconductor devices in the second substrate region not masked by the second mask comprises forming one or more silicon Fin Field Effect Transistors having a dummy gate, wherein forming, at least partially, the one or more III-V semiconductor devices from the grown III-V material comprises forming a High-Electron-Mobility transistors having a dummy gate, and wherein the method further comprises:
- providing a dielectric material on both substrate regions in such a way that the dielectric material possesses a flat top surface coplanar with an exposed top surface of the dummy gate of the one or more silicon Fin Field Effect Transistors;
- replacing the dummy gate of the one or more silicon Fin Field Effect Transistors by a metal gate;
- providing a dielectric material on both substrate regions in such a way that the dielectric material possesses a flat top surface covering the metal gate of the one or more silicon Fin Field Effect Transistors; and
- replacing the dummy gate of the High-Electron-Mobility transistor by a metal gate.

10. The method according to claim 9, further comprising providing a silicon oxide as the dielectric material and obtaining a flat top surface involves a chemical mechanical planarization step of the silicon oxide.

11. The method according to claim 10, wherein the one or more silicon semiconductor devices comprise one or more Fin Field Effect Transistors and wherein forming, at least partially, the one or more silicon semiconductor devices in the second substrate region not masked by the second mask comprises:
- etching one or more silicon fins in the silicon substrate;
- providing a dielectric material on the second substrate region in such a way as to cover the one or more silicon fins;
- planarizing the dielectric material by chemical mechanical planarization until the dielectric material is coplanar with a top surface of the one or more silicon fins;
- recessing the dielectric material around the one or more silicon fins so as to partly uncover the one or more silicon fins;
- forming dummy gates across the one or more silicon fins;
- forming spacers on sidewalls of the one or more silicon fins; and
- forming sources and drains.

12. The method according to any one of claim 11 wherein the second cavity is a V-shaped groove.

* * * * *